United States Patent [19]

Stearns

[11] Patent Number: 5,138,266
[45] Date of Patent: Aug. 11, 1992

[54] SINGLE-PROBE CHARGE MEASUREMENT TESTING METHOD

[75] Inventor: Ellsworth W. Stearns, Hudson, Mass.

[73] Assignee: Digital Equipment Corporation, Maynard, Mass.

[21] Appl. No.: 640,553

[22] Filed: Jan. 14, 1991

Related U.S. Application Data

[63] Continuation of Ser. No. 424,654, Oct. 20, 1989, abandoned.

[51] Int. Cl.⁵ .................................................. G01R 31/02
[52] U.S. Cl. ................................. 324/537; 324/158 R
[58] Field of Search ............... 324/501, 537, 551, 554, 324/567, 663, 671, 678, 158 F, 158 R, 73.1

[56] References Cited

U.S. PATENT DOCUMENTS

| | | | |
|---|---|---|---|
| 3,796,947 | 3/1974 | Harrod et al. | 324/501 |
| 4,001,686 | 1/1977 | Radichel | 324/537 X |
| 4,229,693 | 10/1980 | Irick et al. | 324/73 |
| 4,565,966 | 1/1986 | Burr et al. | 324/73 |
| 4,573,008 | 2/1986 | Lischke | 324/158 R |
| 4,583,042 | 4/1986 | Riemer | 324/537 X |

OTHER PUBLICATIONS

Woodward et al., "Voltage Contrast Electron Beam Testing Experiments on Very Large Scale Integrated Circuit Chip Packaging Substrates", J. Vac. Sci. Tech., Nov./Dec. 1988, p. 1966.
Paul May et al., "Laser Pulsed E-Beam System for High-Speed I.C. Testing", Abstract No. 129, Extended Abstracts, The Electrochem. Soc., Spring Meet., May 10, 1987.
Weiner et al. "Picosecond Temporal Resolution Photoemissive Sampling", Applied Physics Letters, May 1987.
R. B. Marcus et al., "High-Speed Electrical Sampling by fs Photoemission", Applied Physics Letters, 11 Aug. 1986, p. 357.

*Primary Examiner*—Jack B. Harvey
*Attorney, Agent, or Firm*—Arnold, White & Durkee

[57] ABSTRACT

A test arrangement for printed wiring boards or the like employs a probe to contact the various nodes on the circuit board and charge or discharge these nodes. A reference plane of electrically conductive material is closely spaced from the board under test, and a charge-transfer detection or measurement arrangement is connected to this reference plane. The circuit board is mounted on an X-Y positioning mechanism while the test is being conducted, so the probe can be selectively applied to each of the conductive nodes of the circuit board. The charging of the nodes by capacitive coupling to the reference plane is measured and correlated with the probe position to provide an indication of circuit integrity. The measurements made on the board under test are compared with a reference data file of the X-Y coordinates of the nodes to determine whether or not there are discrepancies, and if so, the locations.

20 Claims, 1 Drawing Sheet

SINGLE-PROBE CHARGE MEASUREMENT TESTING METHOD

This is a continuation of U.S. Ser. No. 424,654 filed Oct. 20, 1989, now abandoned.

BACKGROUND OF THE INVENTION

This invention relates to methods for testing electrical devices, and more particularly to a testing arrangement for printed circuit boards or the like.

Electrical components such as printed (or etched) circuit boards must be tested after manufacture has been completed. The testing is primarily directed to determining whether or not all of the conductive paths are in their designated positions and no conductors are unintentionally shorted, and whether electrical continuity exists where it should. Various functional tests may be executed using the external connectors (those included for operation in the end equipment), and also visual inspection can provide an indication of the quality of the part. Such methods can be time-consuming and expensive, however, and in any event are not always effective in discovering shorts or opens which may be hidden from view or not exercised in the electrical functional tests chosen. For these reasons, various other test mechanisms have been proposed which perform the function of scanning the surface of a etched circuit board and providing an indication of the wiring integrity.

One example of prior testing methods used electron beam technology to scan an integrated circuit chip or an etched circuit board under test while detecting secondary electrons emitted by the pattern on the board. One of these methods is referred to as a Voltage Contrast Electron Beam (VCEB) technique; these testers are like logic analyzers which probe functional electronic circuits on semiconductor integrated circuit chips. The VCEB technique is described by Woodard et al, J. Vac. Sci. Technol., November/December 1988, p. 1966, "Voltage Contrast Electron Beam Testing Experiments on Very Large Scale Integrated Circuit Chip Packaging Substrates". When used for testing relatively large devices such as printed wiring boards, the VCEB technique requires complex and expensive electron beam generating and deflecting arrangements, as well as requiring a large evacuated chamber.

In copending application Ser. No. 424,396, filed Oct. 20, 1989 by Richard I. Mellitz for Electro-emissive Laser Stimulated Test, assigned to Digital Equipment Corporation, a testing method is described which uses a laser beam to scan an electro-emissive grid positioned over the board under test, and the grid emits electrons to charge nodes on the board; this charging can be detected to check the integrity of the conductor paths on the board. While this method avoids the difficulties of handling an E-beam, and is thus much less expensive, there is nevertheless still the necessity for an evacuated chamber, and other expensive components.

In U.S. Pat. No. 4,565,966 a method for testing circuit boards is disclosed which uses two probes for making resistive or RF impedance measurements to verify the integrity of the boards. This method, however, requires two probes, each with their attendant X-Y-Z positioning mechanisms, and a capacitance data file.

In U.S. Pat. No. 4,229,693 a single-probe capacitance measurement method is described, used in testing of printed circuit boards. A probe is used to make contact to the conductors of the board to measure the capacitance to thereby detect open circuit and short circuit networks on the board. This technique, however, does not provide any facility for measuring any previous electrical states of the network being probed. Thus, when two or more networks have been identified as open or shorted, they must be located and verified with two probes using a resistance type of measurement. Further, this method requires that the capacitance values of each network be known. In order to acquire this data, a known good module must be available to obtain the capacitance values since they cannot easily be calculated, or a group of unknown modules may be used and the results analyzed to obtain the values. Commercial equipment available using this type of testing method includes a Teledyne TAC capacitance probing system.

SUMMARY OF THE INVENTION

In accordance with one embodiment of the invention, a test arrangement for electrical parts such as etched circuits or integrated circuit packages or the like employs a probe to contact the various nodes on the circuit board and charge or discharge these nodes. A reference plane of electrically conductive material is closely spaced from the board under test, and a charge-transfer measurement arrangement is connected to this reference plane. The circuit board is mounted on an X-Y positioning mechanism while the test is being conducted, so the probe can be selectively applied to each of the conductive nodes of the circuit board. The charging of the nodes by capacitive coupling to the reference plane is measured and correlated with the probe position to provide an indication of circuit integrity. The measurements made on the board under test are compared with a reference data file of the X-Y coordinates of the nodes to determine whether or not there are discrepancies, and if so, the locations.

BRIEF DESCRIPTION OF THE DRAWINGS

The novel features believed characteristic of the invention are set forth in the appended claims. The invention itself, however, as well as other features and advantages thereof, will be best understood by reference to the detailed description of specific embodiments which follows, when read in conjunction with the accompanying drawings, wherein:

DETAILED DESCRIPTION OF SPECIFIC EMBODIMENT

Figure 1:
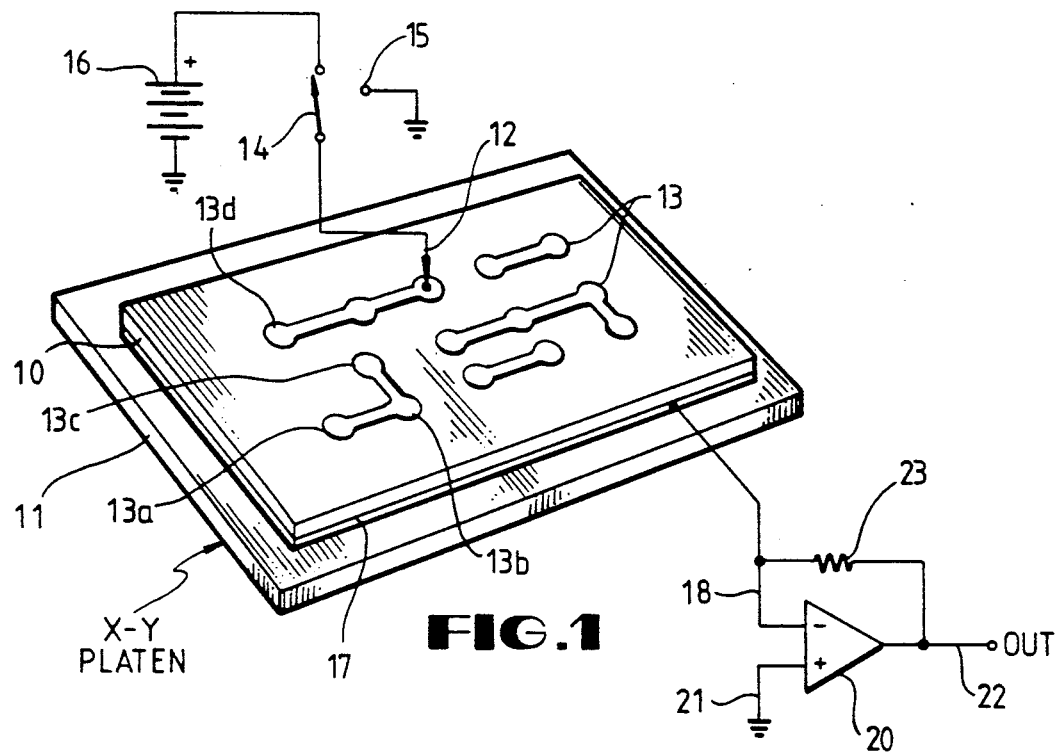
FIG. 1 is a pictorial view of a test arrangement for printed circuit boards or the like, according to one embodiment of the invention.
Figure 2:
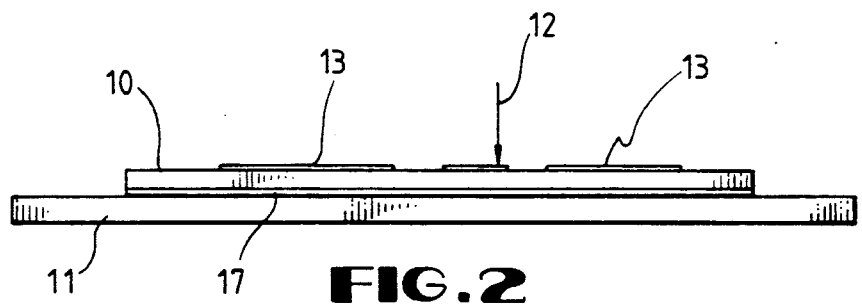
FIG. 2 is an elevation view of the apparatus of FIG. 1.

Referring to FIGS. 1 and 2, a test arrangement for printed wiring boards or the like is illustrated according to one embodiment of the invention. A part under test, in this example a printed wiring board 10, is positioned on an X-Y platen 11 so that the board 10 may be moved in X and Y directions beneath a single probe 12. The probe 12 is movable in the Z direction (vertical) by a suitable mechanism, so the probe may be brought into contact selectively with each one of the significant nodes 13 on the board 10. A switching arrangement is connected to the probe 12 so that the probe can be selectively connected to either a ground terminal 15 for discharging the node 13 to which the probe is applied, or to a voltage supply 16 for charging the node. The module under test or board 10 has a conductive reference plane 17 in close proximity, so that all of the nodes 13 are capacitively coupled to the reference plane. The capacitance between each individual node 13 and the reference plane 17 is such that when a node is charged from the voltage supply 16 via the probe 12 the node will stay charged for a considerable time; the impedance through the circuit board 10 from a node 13 to ground or other path is very high, measured in thousands of megohms, so the discharge time is quite long, several minutes, perhaps an hour. The reference plane 17 is connected to an input 18 of a differential op amp 20, with the other input 21 being connected to ground. The output 22 of the op amp is coupled back to the input 18 through a resistor 23 as negative feedback.

Figure 3:
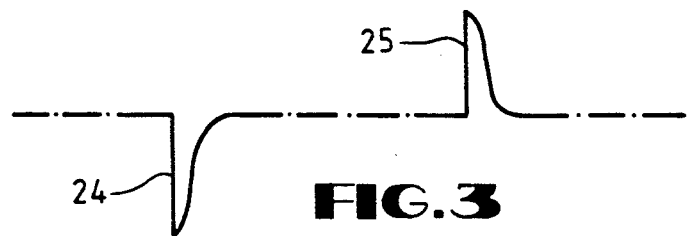
FIG. 3 is a timing diagram showing voltage vs. time for events occurring in the test arrangement of FIGS. 1 and 2, correlated with the probe movement.

Referring to FIG. 3, the voltage on the output 22 is seen to exhibit a positive-going spike 25 when a node 13 is discharged, i.e., when the switch is in position 15 and the node 13 discharges to ground. When the node 13 charges, i.e., when the node 13 is contacted by the probe 12 with the switch making connection to the voltage source 16, the voltage on the output 22 exhibits a spike 24 of the opposite polarity. If the probe 12 is moved from node 13a (after charging the node 13a) to the node 13b, then, since the node 13b is supposed to be connected to the node 13a by the metallization path on the board, there will be no spike 24 because the node 13b is already charged; the entire metallization path including the nodes 13a 13b and 13c will remain charged for a time period determined by the leakage paths, or until contacted by the probe 12 with the switch in the position 15. On the other hand, if the conductive path from the node 13a to the node 13b has an open circuit, the output voltage on the output 22 will again exhibit a spike 24 when contacted by the probe 12, and so this will indicate a fault. In like manner, when the probe 12 is moved to the node 13d, a spike 24 should be exhibited at the output 22, indicating that this node is being charged; if a short exists between the nodes 13a, 13b or 13c and the node 13d, then the absence of a spike 24 at the output 22 will indicate a fault. It is thus seen that the testing operation involves recording a sequence of voltage outputs correlated with the physical X-Y-Z positioning of the platen 11 and the probe 12, and comparing these with the X-Y coordinate file defining the node positions. In this embodiment, there is no need for a qualitative measurement of the capacitance of the nodes 13, but instead the presence or absence of a spike 24 at the output 22 at the X-Y position in question is the only indication needed.

In another embodiment, the time needed to determine which nodes and networks of nodes 13 are shorted together can be significantly reduced by simply measuring the charge magnitude (i.e., measuring the capacitance, using the charge method) of the networks involved. This will reduce the amount of probing sequences necessary to identify which ones of the nodes are shorted together. For example, assume that a module under test has twenty-five shorted networks of nodes 13 (e.g., the nodes 13a, 13b and 13c represent a network of nodes shorted together). The number of tests (probing sequences) required using the charge transfer detection method as described above in this case would be $$t = n!/2*(n-2)! = 300 \text{ tests}$$

where t is the number of tests (probes and observations), n is the number of shorted networks, and ! is the factorial operator. That is, every shorted network has to be tested against every other shorted network of nodes to see if there is a short between networks, and if so, to isolate the short. In contrast, if a charge magnitude measurement (size and shape of the pulses 24 or 25 quantitatively measured) were used, the number of probes and observations is substantially reduced. If we assume that the number of networks g1 of 1—pf is ten, the number of networks g2 of 4—pf is seven, and the number of networks g3 of 15—pf is eight (where pf is the capacitance in picofarads, and where g1, g2 and g3 are variables, each variable referring to a set of nodes such as the set of nodes 13a, 13b and 13c referred to above), then the number of tests needed is $$\begin{aligned}t &= g1!/2*(g1! - 2) + g2!/2*(g2! - 2) + g3!/2*(g3! - 2)\\ &= 45 + 21 + 24\\ &= 90 \text{ tests}\end{aligned}$$

It is thus seen that the methods of the invention can greatly reduce the costs of these types of opens-shorts tests of printed wiring boards or the like, for several reasons. First, the need for using two separate contacting probes and their attendant X-Y-Z positioning mechanisms, as was needed in the resistance-measuring methods as discussed above, are eliminated. Second, the requirement for a capacitance value data file is eliminated, and this includes both the creation and maintenance of such a file. Third, the requirements in complexity for the X-Y-Z positioning mechanism are reduced to merely alignment with the module 10 under test. Fourth, high resistance leakage paths in the one-hundred megohm range can be detected using the charge measurement type of testing as described above, whereas such resistance paths can be detected using resistance measuring methods only if high voltage stimulus in the 200-300 volt range is used.

While this invention has been described with reference to specific embodiments, this description is not meant to be construed in a limiting sense. Various modifications of the disclosed embodiments, as well as other embodiments of the invention, will be apparent to persons skilled in the art upon reference to this description. It is therefore contemplated that the appended claims will cover any such modifications or embodiments as fall within the true scope of the invention.

What is claimed is:

1. Apparatus for testing an electrical part having a plurality of conductive paths thereon, comprising:
   a) a moveable conductive single probe for providing a path to apply or remove charge selectively to a sequence of said conductive paths on said part by directly contacting said conductive paths;
   b) a reference plane capacitively coupled to said conductive paths;
   c) detector means in series circuit with said single probe and said reference plane responsive to the amount and direction of charge transferred by said single probe to or from each conductive path in said sequence of conductive paths as a function of the position of said probe in said sequence.

2. Apparatus according to claim 1 wherein said reference plane is located on the opposite side of said part from said probe.

3. Apparatus according to claim 1 wherein said conductive probe is selectively connectable to a voltage supply or to ground for charging or discharging each of said conductive paths.

4. Apparatus according to claim 1 wherein said part is a printed wiring board.

5. Apparatus according to claim 1 including means for X-Y positioning of said part.

6. A method of testing a device having a plurality of conductive paths thereon, comprising the steps of:
   a) providing a path to apply a charge to selected ones of said conductive paths by a single probe in a sequence by directly contacting said selected ones;
   b) detecting whether or not charge is transferred by said probe to each of said selected ones of said conductive paths, said step of detecting being performed by measuring current in a series path including said single probe.

7. A method according to claim 6 wherein said step of detecting includes capacitively coupling said device to a reference plane and detecting charge transfer to said reference plane.

8. A method according to claim 7 wherein said step of detecting is by detecting capacitive current flow between said reference plane and ground.

9. A method according to claim 6 including the step of positioning said device by an X-Y movement mechanism.

10. A method according to claim 6 wherein said device is a printed wiring grid.

11. A method according to claim 6 wherein said probe is selectively connectable to a voltage supply or to ground for charging or discharging each of said conductive paths.

12. A method of testing a device having a plurality of conductive paths thereon, comprising the steps of:
   a) selectively contacting said conductive paths by a single probe in a sequence and providing a path to apply a charge to or remove charge from said conductive paths via said probe;
   b) detecting the amount of charge transferred by said probe to or from each of said conductive paths as a function of the position of said probe and a function of said sequence, said step of detecting being performed by measuring current in a series path including said single probe;
   c) and comparing said detected amount of charge transfer with a reference pattern of charge transfer.

13. A method according to claim 12 wherein said step of detecting includes capacitively coupling said device to a reference plane and detecting charge transfer to said reference plane.

14. A method according to claim 13 wherein said step of detecting is by measuring capacitive current flow between said reference plane and ground.

15. A method according to claim 12 including the step of positioning said device by an X-Y movement mechanism.

16. Apparatus for testing an electrical part having a plurality of conductive paths thereon, comprising:
   a) a single probe movable across the surface of said part to selectively contact the conductive paths thereon to apply an electrical charge thereto, in a sequence of said conductive paths;
   b) a conductive reference plane coupled to said part; and
   c) a detector coupled to said reference plane and in series circuit with said single probe, the detector being responsive to the amount of charge transferred by said probe to or from said conductive paths as a function of the position of said probe and a function of said sequence.

17. Apparatus according to claim 16 wherein said reference plane is located on the opposite side of said device from said probe.

18. Apparatus according to claim 16 wherein said device is a printed wiring board.

19. Apparatus according to claim 16 including means for X-Y positioning of said device and said reference plane.

20. Apparatus according to claim 16 including means connected to said probe for selectively grounding or applying a voltage source to said conductive paths by said probe.

* * * * *